(12) United States Patent
Yamanaka

(10) Patent No.: US 7,788,573 B2
(45) Date of Patent: Aug. 31, 2010

(54) FAULT DETECTION METHOD, TEST CIRCUIT AND SEMICONDUCTOR DEVICE

(75) Inventor: Hiroaki Yamanaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1002 days.

(21) Appl. No.: 11/541,654

(22) Filed: Oct. 3, 2006

(65) Prior Publication Data

US 2008/0122471 A1    May 29, 2008

(30) Foreign Application Priority Data

Jun. 28, 2006    (JP) .............................. 2006-178476

(51) Int. Cl.
*G06F 11/00*    (2006.01)
*G01R 31/28*    (2006.01)

(52) U.S. Cl. ...................... 714/799; 714/726; 714/815

(58) Field of Classification Search .................. 714/724, 714/726, 733, 734, 30, 814, 815, 799
See application file for complete search history.

(56) References Cited

U.S. PATENT DOCUMENTS 3,343,133 A * 9/1967 Dirks ......................... 711/112
5,539,747 A * 7/1996 Ito et al. ..................... 370/235
5,867,542 A * 2/1999 Iwamatsu et al. ........... 375/354
RE40,695 E * 4/2009 Iwamatsu et al. ........... 375/354

\* cited by examiner

*Primary Examiner*—Phung M Chung
(74) *Attorney, Agent, or Firm*—Arent Fox LLP

(57) ABSTRACT

A fault detection method for detects, within a semiconductor device, a fault in a delay chain that is provided within the semiconductor device and is made up of delay parts that are each formed by delay cells. The method judges if a fault exists in a first specific delay cell within a first delay part when testing the first specific delay cell, by detecting a first relative delay time between input and output signals of the first specific delay cell, and processing the first relative delay time at a timing based on an output of a delay cell within a second delay part that is provided at a stage preceding or subsequent to the first delay part. The method judges if a fault exists in a second specific delay cell within the second delay part exists when testing the second specific delay cell, by detecting a second relative delay time between input and output signals of the second specific delay cell, and processing the second relative delay time at a timing based on an output of a delay cell within the first delay part.

15 Claims, 17 Drawing Sheets

FAULT DETECTION METHOD, TEST CIRCUIT AND SEMICONDUCTOR DEVICE

BACKGROUND OF THE INVENTION

1. Field of the Invention

The present invention generally relates to fault detection methods, test circuits and semiconductor devices, and more particularly to a fault detection method for detecting a fault in a circuit that has a delay chain, a test circuit using such a fault detection method, and a semiconductor device having such a test circuit.

2. Description of the Related Art

Semiconductor devices having a delay chain made up of a plurality of delay cells are known. One example of the semiconductor circuit having the delay chain is a delay locked loop (DLL) circuit which controls and adjusts a time difference between an external clock and an internal clock by circuitry, so as to realize a high-speed clock access (or short clock access time) and a high operation frequency. In such a semiconductor circuit, if a certain delay cell fails, the delay chain cannot generate the correct delay, and the circuit cannot carry out the correct operation. Hence, when forwarding the semiconductor device (or semiconductor chip) having the semiconductor circuit from a factory, a test is carried out by inputting a test pattern from a tester to the delay chain, and judging whether or not a fault exists in the delay cell by the tester based on an output of the semiconductor device.

As the operation speed of the semiconductor circuit becomes higher, the pulse width of the signals input to and output from the delay chain becomes extremely narrow, and the signal frequency input to and output from the delay chain becomes extremely high. However, according to the existing technology, in order to enable the test to be carried out by an external tester by outputting an undistorted signal waveform from the semiconductor device, the pulse width must be approximately 4 ns or wider and the signal frequency must be approximately 250 MHz or lower. If the pulse width is less than approximately 4 ns or, if the signal frequency exceeds 250. MHz, the signal waveform is distorted when the signal waveform is output from the semiconductor device to the external tester, due to the capacitance of terminals (or pins) or an output load of the semiconductor device. Accordingly, there was a problem in that it is impossible to accurately detect the fault of the delay chain when the pulse width of the signal input to or output from the delay chain is extremely narrow or the signal frequency input to or output from the delay chain is extremely high.

SUMMARY OF THE INVENTION

Accordingly, it is a general object of the present invention to provide a novel and useful fault detection method, test circuit and semiconductor device, in which the problems described above are suppressed.

Another and more specific object of the present invention is to provide a fault detection method, a test circuit and a semiconductor device, which can accurately and positively detect a fault in a delay chain, even if the pulse width of the signal input to or output from the delay chain is extremely narrow or the signal frequency input to or output from the delay chain is extremely high.

Still another object of the present invention is to provide a fault detection method for detecting, within a semiconductor device, a fault in a delay chain that is provided within the semiconductor device and is made up of a plurality of delay parts that are each formed by a plurality of delay cells, comprising a first judging step judging whether or not a fault of a first specific delay cell within a first delay part exists when testing the first specific delay cell, by detecting a first relative delay time between input and output signals of the first specific delay cell, and processing the first relative delay time at a timing based on an output of a delay cell within a second delay part that is provided at a stage preceding or subsequent to the first delay part; and a second judging step judging whether or not a fault of a second specific delay cell within the second delay part exists when testing the second specific delay cell, by detecting a second relative delay time between input and output signals of the second specific delay cell, and processing the second relative delay time at a timing based on an output of a delay cell within the first delay part. According to the test circuit of the present invention, it is possible to accurately and positively detect a fault in a delay chain, even if the pulse width of the signal input to or output from the delay chain is extremely narrow or the signal frequency input to or output from the delay chain is extremely high.

A further object of the present invention is to provide a test circuit for a delay chain made up of a plurality of delay parts that are each formed by a plurality of delay cells, comprising a first test circuit configured to test a first specific delay cell within a first delay part by detecting a first relative delay time between input and output signals of the first specific delay cell; and a second test circuit configured to test a second specific delay cell within a second delay part that is provided at a stage preceding or subsequent to the first delay part by detecting a second relative delay-time between input and output signals of the second specific delay cell, wherein the first test circuit judges whether or not a fault of the first specific delay cell exists by processing the first relative delay time at a timing based on an output of a delay cell within the second delay part, and the second test circuit judges whether or not a fault of the second specific delay cell exists by processing the second relative delay time at a timing based on an output of a delay cell within the first delay part. According to the test circuit of the present invention, it is possible to accurately and positively detect a fault in a delay chain, even if the pulse width of the signal input to or output from the delay chain is extremely narrow or the signal frequency input to or output from the delay chain is extremely high.

Another object of the present invention is to provide a semiconductor device comprising a delay chain, provided on a substrate, and made up of a plurality of delay parts that are each formed by a plurality of delay cells; and a test circuit provided on the substrate, the test circuit comprising a first test circuit configured to test a first specific delay cell within a first delay part by detecting a first relative delay time between input and output signals of the first specific delay cell; and a second test circuit configured to test a second specific delay cell within a second delay part that is provided at a stage preceding or subsequent to the first delay part by detecting a second relative delay time between input and output signals of the second specific delay cell, wherein the first test circuit judges whether or not a fault of the first specific delay cell exists by processing the first relative delay time at a timing based on an output of a delay cell within the second delay part, and the second test circuit judges whether or not a fault of the second specific delay cell exists by processing the second relative delay time at a timing based on an output of a delay cell within the first delay part. According to the semiconductor device of the present invention, it is possible to accurately and positively detect a fault in a delay chain, even if the pulse width of the signal input to or output from the delay chain is extremely narrow or the signal frequency input to or output from the delay chain is extremely high.

Other objects and further features of the present invention will be apparent from the following detailed description when read in conjunction with the accompanying drawings.

DESCRIPTION OF THE PREFERRED EMBODIMENTS

Figure 1:
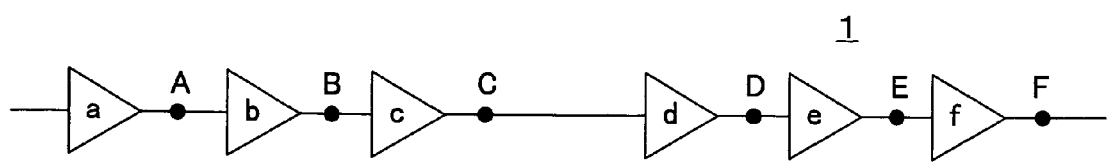
FIG. 1 is a diagram showing a delay chain made up of a plurality of delay cells.

A fault detection method of the present invention detects a fault in a delay chain of a semiconductor circuit within a semiconductor device, using a test circuit within the semiconductor device. The delay chain is made up of a plurality of delay parts that are connected in series, where each delay part has a plurality of delay cells. In a case where the delay chain is formed by two delay parts and a specific delay cell within a first delay part is to be tested, a relative delay time between input and output signals of this specific delay cell is detected, and the relative delay time is processed at a timing that is based on an output of a specific delay cell within a second delay part that is connected to a stage subsequent to the first delay part, so as to judge whether or not a fault exists in the specific delay cell within the first delay part. When testing the specific delay cell within the second delay part, a relative delay time between input and output signals of this specific delay cell is detected, and the relative delay time is processed at a timing that is based on the output of the specific delay cell within the first delay part that is connected to a stage preceding the second delay part, so as to judge whether or not a fault exists in the specific delay cell within the second delay part.

Because the test circuit within the semiconductor device judges whether or not a fault exists in the delay cell, it is possible to detect the fault in the delay chain regardless of the capacitance of terminals (or pins) or the output load of the semiconductor device. Accordingly, unlike the case where the output signal of the semiconductor device is output to an external tester at the time of the testing, the signal waveform will not be distorted. For this reason, even if the pulse width that is output from the delay chain is extremely narrow or the signal frequency input to or output from the delay chain is extremely high, it is possible to accurately and positively detect the fault in the delay chain.

Next, a description will be given of each of embodiments of the fault detection method, the test circuit and the semiconductor device according to the present invention, by referring to the drawings.

First, a description will be given of a case where the delay chain is operating normally and a case where the delay chain is not operating normally due to a fault in a delay cell, by referring to FIGS. 1 through 3.

Figure 2:
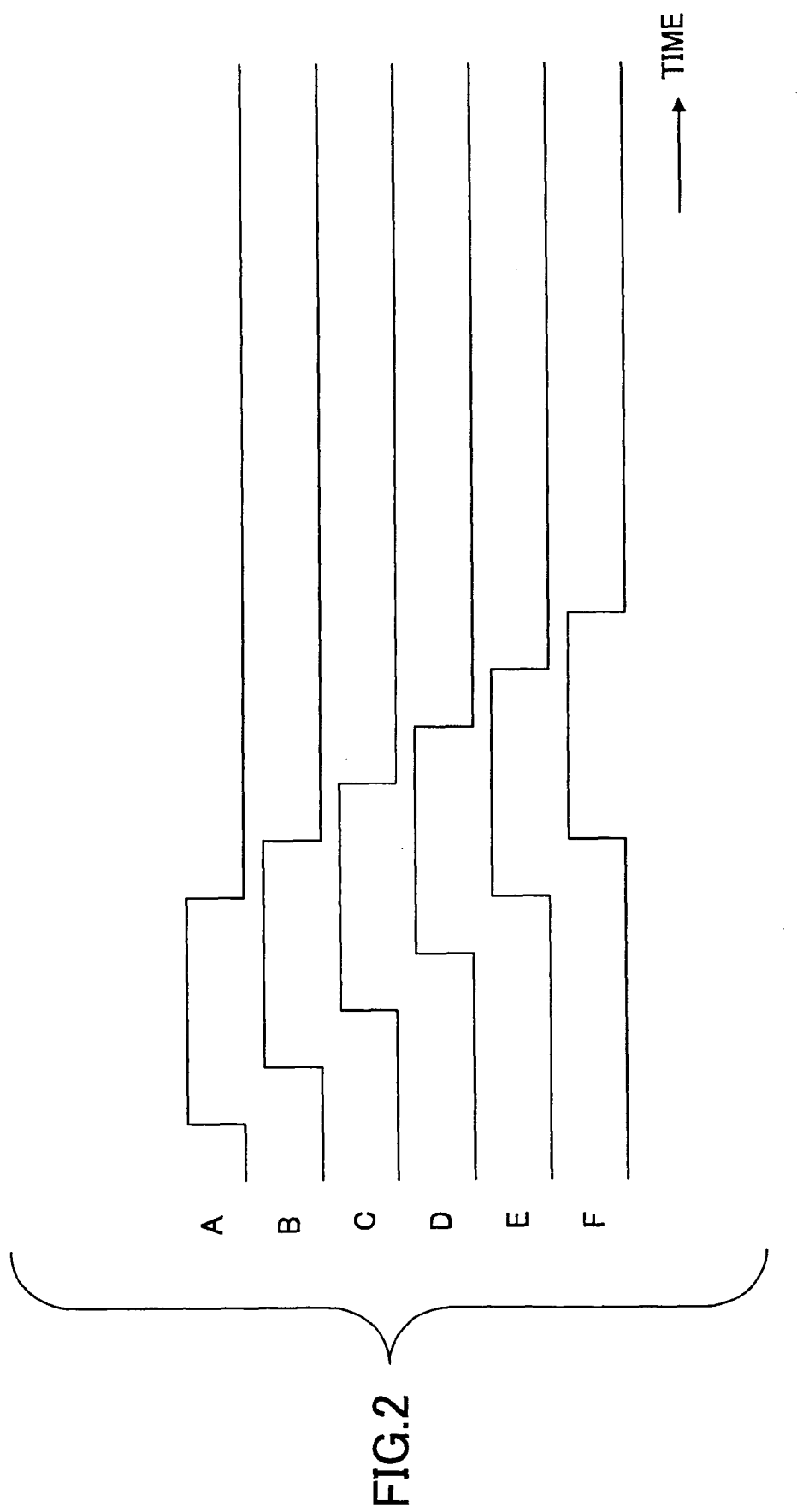
FIG. 2 is a timing chart showing output signals of delay cells of the delay chain when the delay chain is operating normally.

FIG. 1 is a diagram showing a delay chain 1 made up of a plurality of delay cells (or delay elements) a through f. The delay chain 1 is included in a semiconductor circuit (not shown), such as a DLL circuit, within a semiconductor device (not shown). FIG. 2 is a timing chart showing output signals A through F of the delay cells a through f of the delay chain 1, at nodes A through F, when the delay chain 1 is operating normally. On the other hand, FIG. 3 is a timing chart showing the output signals A through F of the delay cells a through f of the delay chain 1, at the nodes A through F, when a delay cell b fails. It is assumed for the sake of convenience that there is no wiring delay (or interconnection delay) among the delay cells a through f, and the same holds true for the embodiments described hereunder.

Figure 3:
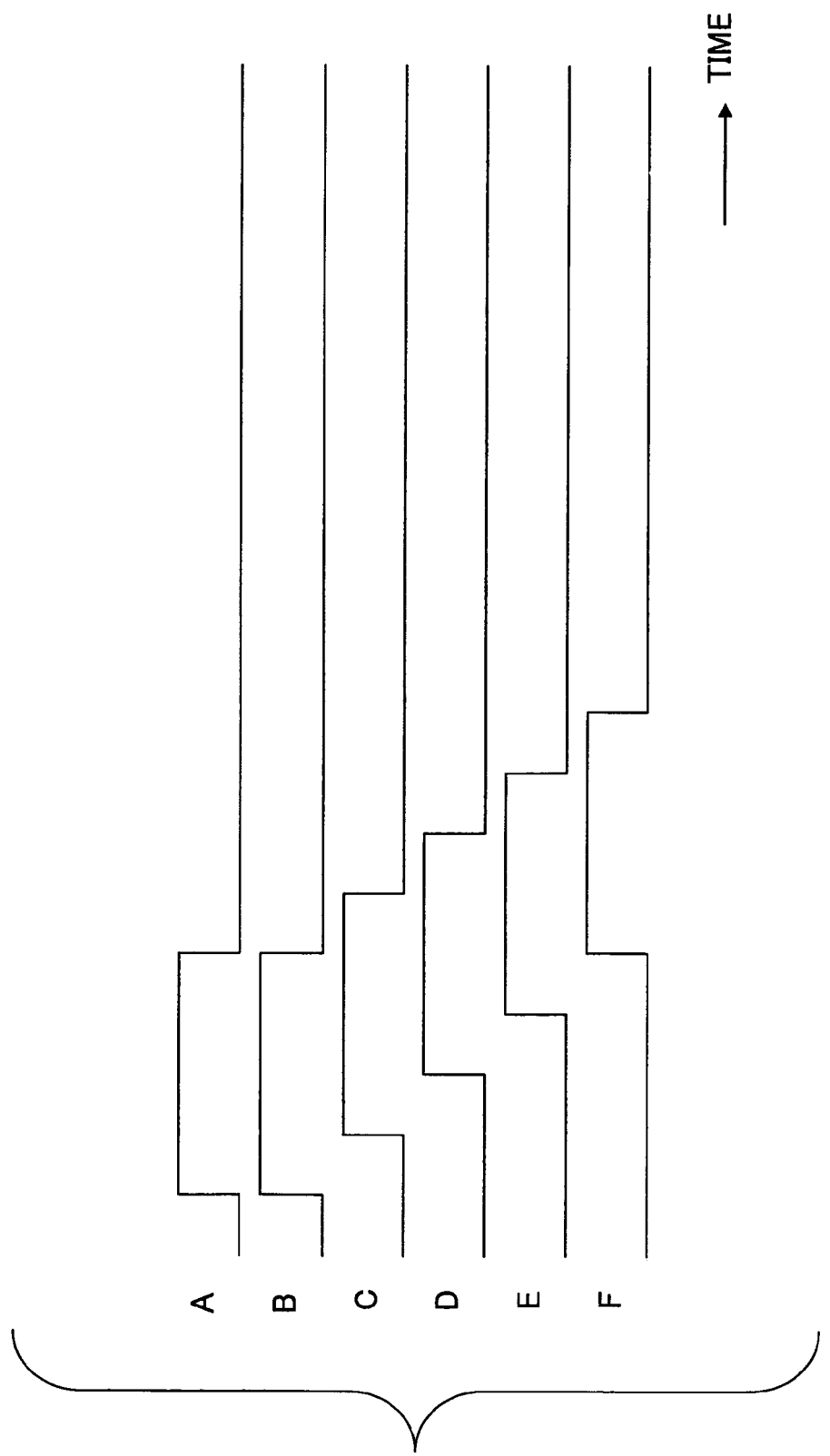
FIG. 3 is a timing chart showing the output signals of the delay cells of the delay chain when a delay cell fails.

In an embodiment of the present invention, the fault in the delay chain 1, such as that shown in FIG. 3, is detected by the test circuit provided within the semiconductor device. In other words, the test circuit is provided on a substrate, which is the same substrate on which the semiconductor circuit including the delay chain 1 and the like are provided within the semiconductor device.

Figure 4:
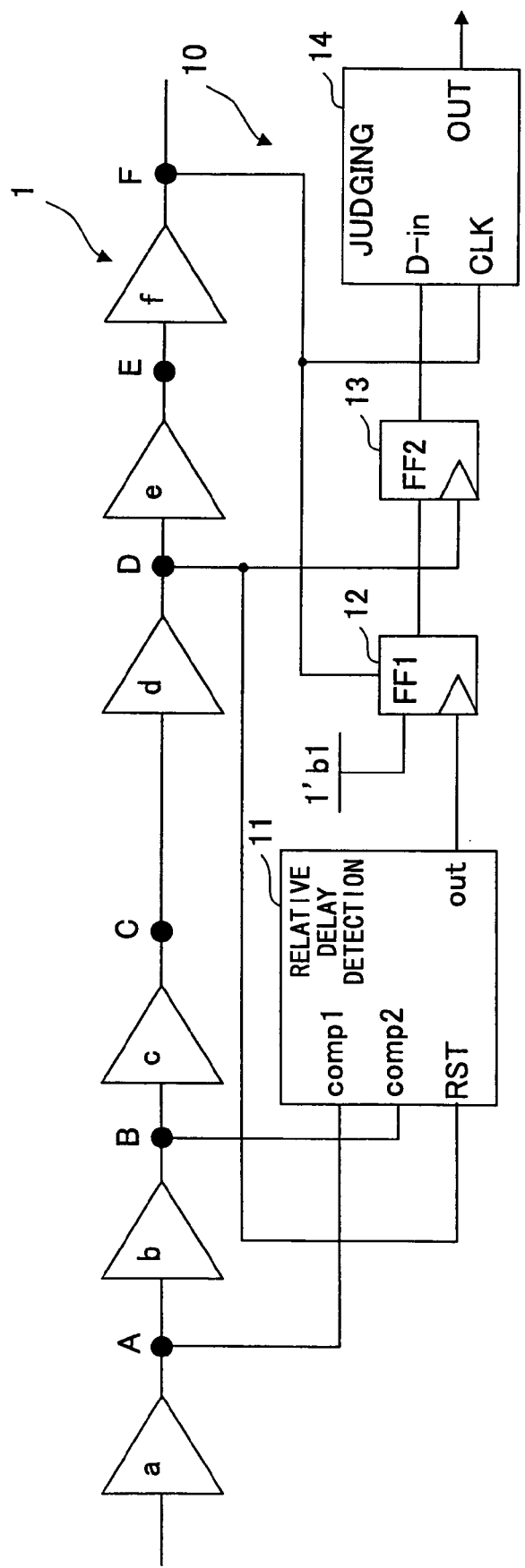
FIG. 4 is a diagram showing an important part of a test circuit that is provided with respect to a delay cell of the delay chain.

FIG. 4 is a diagram showing an important part of the test circuit that is provided with respect to the delay cell b of the delay chain 1. In FIG. 4, those parts that are the same as those corresponding parts in FIG. 1 are designated by the same reference numerals, and a description thereof will be omitted. A test circuit 10 has a relative delay detection circuit (or edge generation circuit) 11, flip-flops (FFs) 12 and 13, and a judging circuit 14. The output signal A (EDGE.comp1) of the delay cell a is input to an input terminal comp1 of the relative delay detection circuit 11, the output signal B (EDGE.comp2) of the delay cell b is input to a input terminal comp2 of the relative delay detection circuit 11, and the output signal D (EDGE.RST) of the delay cell d is input to a reset terminal RST of the relative delay detection circuit 11. An output signal EDGE.OUT (FF1.CLK) that is output from an output terminal out of the relative delay detection circuit 11 is input to a clock input terminal of the flip-flop 12. A fixed signal l'b1 (FF1.D) is input to a data input terminal of the flip-flop 12, and the output signal F (FF1.RST) of the delay cell f is input to a reset terminal of the flip-flop 12. An output signal FF1.Q (FF2.D) of the flip-flop 12 is input to a data input terminal of the flip-flop 13, and the output signal D (FF2.CLK) of the delay cell d is input to a clock terminal of the flip-flop 13. An output signal FF2.Q (D-in) of the flip-flop 13 is input to a data input terminal D-in of the judging circuit 14, and the output signal F (CLK) of the delay cell f is input to a clock input terminal CLK of the judging circuit 14. An output judgement signal OUT is output from an output terminal OUT of the judging circuit 14.

Figure 5:
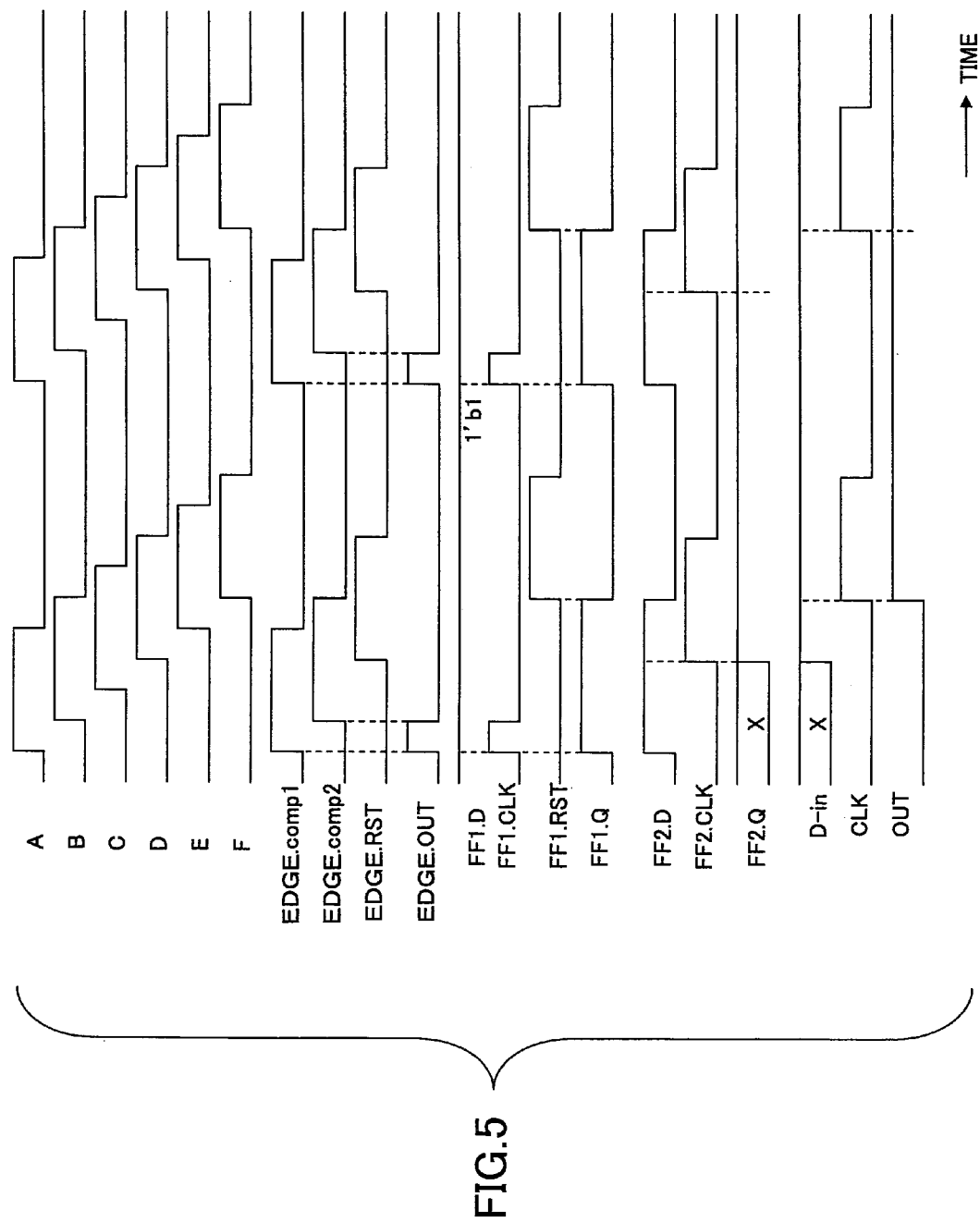
FIG. 5 is a timing chart showing signals at various parts shown in FIG. 4 when the delay chain is operating normally.
Figure 6:
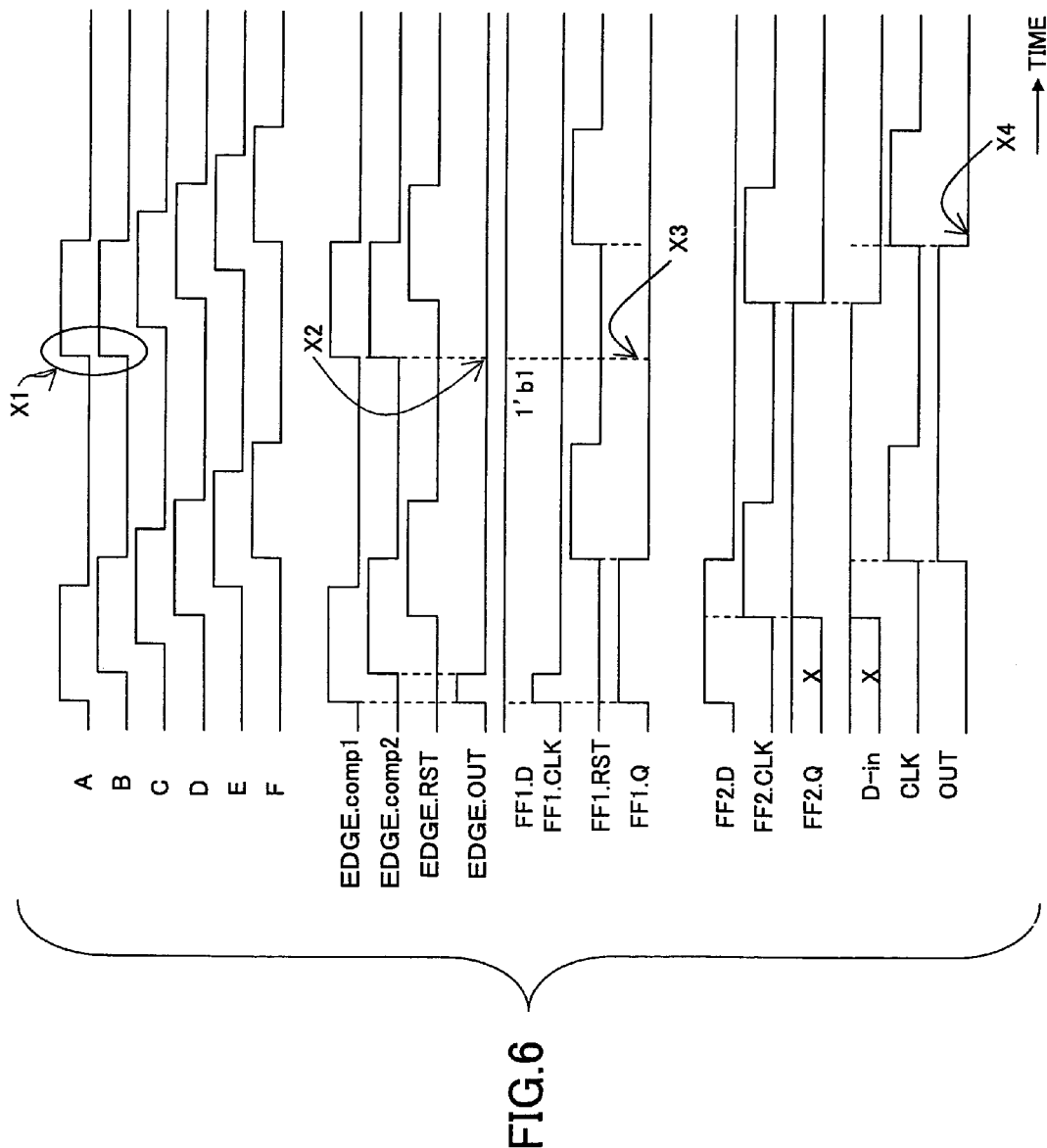
FIG. 6 is a timing chart showing signals at various parts shown in FIG. 4 when the delay chain is not operating normally.

FIG. 5 is a timing chart showing signals at various parts shown in FIG. 4 when the delay cell b of the delay chain 1 is normal and the delay chain 1 is operating normally (that is, operating in a normal manner). On the other hand, FIG. 6 is a timing chart showing signals at various parts shown in FIG. 4 when the delay cell b of the delay chain 1 fails and the delay chain 1 is not operating normally (that is, not operating in a normal manner). As indicated by X1 in FIG. 6, the designed delay is not generated at the delay cell b. For this reason, as indicated by X2 in FIG. 6, a pulse indicating the relative delay is not generated at the output of the relative delay detection circuit 11, and because this pulse indicating the relative delay is not generated, the clock input of the flip-flop 12 does not make a transition to a high level (or a logical level "1") at a position indicated by X3 in FIG. 6. As a result, although the output of the judging circuit 14 has a high level as shown in FIG. 5 when the delay chain 1 is operating normally, the output of the judging circuit 14 has a low level (or a logical level "0") as indicated by X4 in FIG. 6 when the delay cell b fails and the delay chain 1 is not operating normally.

Figure 7:
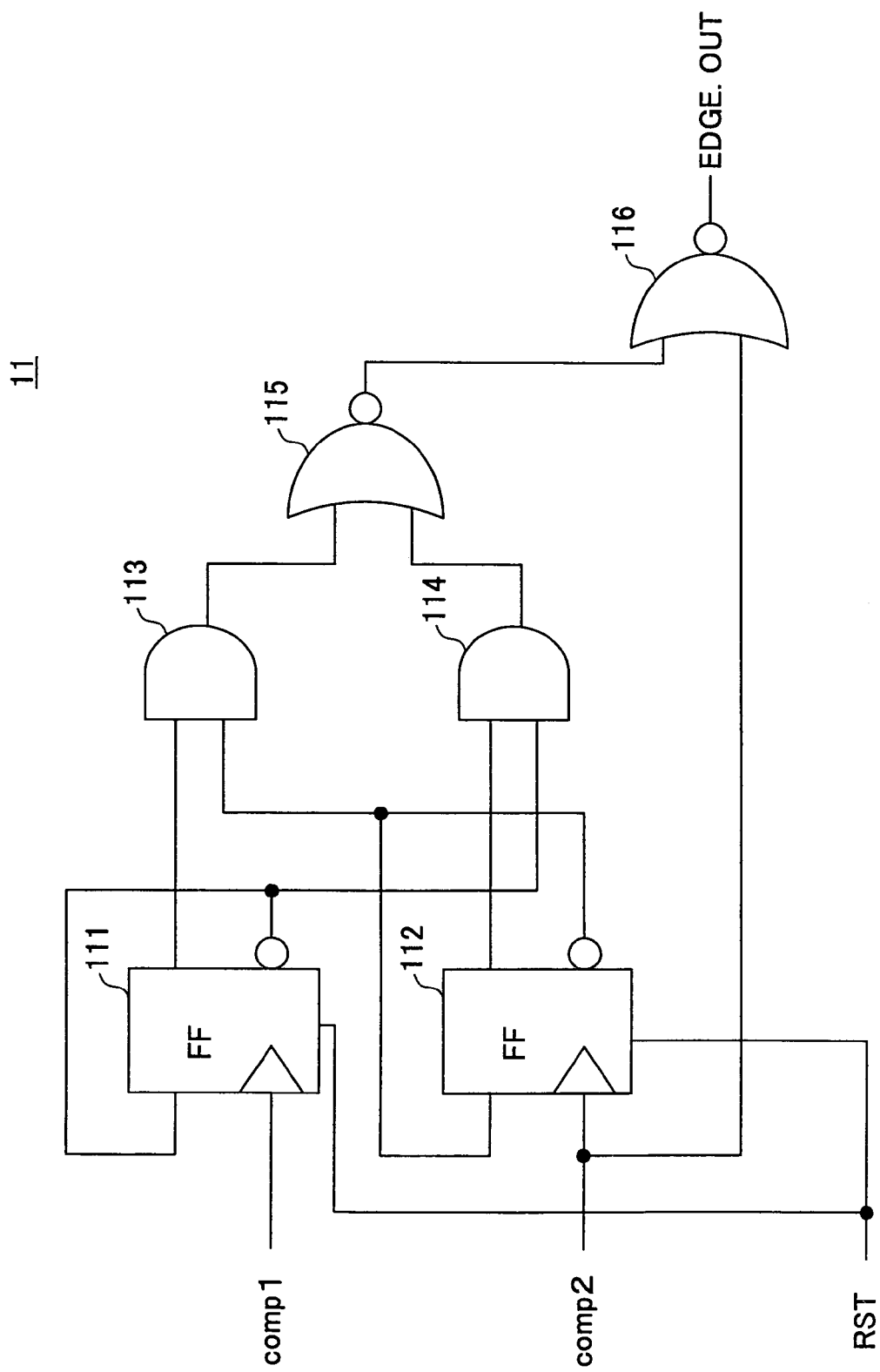
FIG. 7 is a circuit diagram showing a structure of a relative delay detection circuit.

FIG. 7 is a circuit diagram showing a structure of the relative delay detection circuit 11. The relative delay detection circuit 11 has flip-flops 111 and 112, AND circuits 113 and 114, and NOR circuits 115 and 116 which are connected as shown in FIG. 7. The input signal of a target delay cell (in this case, the delay cell b), that is the target of the test within the delay chain 1, is input to the input terminal comp1. The output signal of the target delay cell (in this case, the delay cell b), that is the target of the test within the delay chain 1, is input to the input terminal comp2. In addition, a signal, which forcibly resets the relative delay detection circuit 11 at a timing not exceeding 1 period of the input signal of the delay chain 1, is input to the reset terminal RST.

Figure 8:
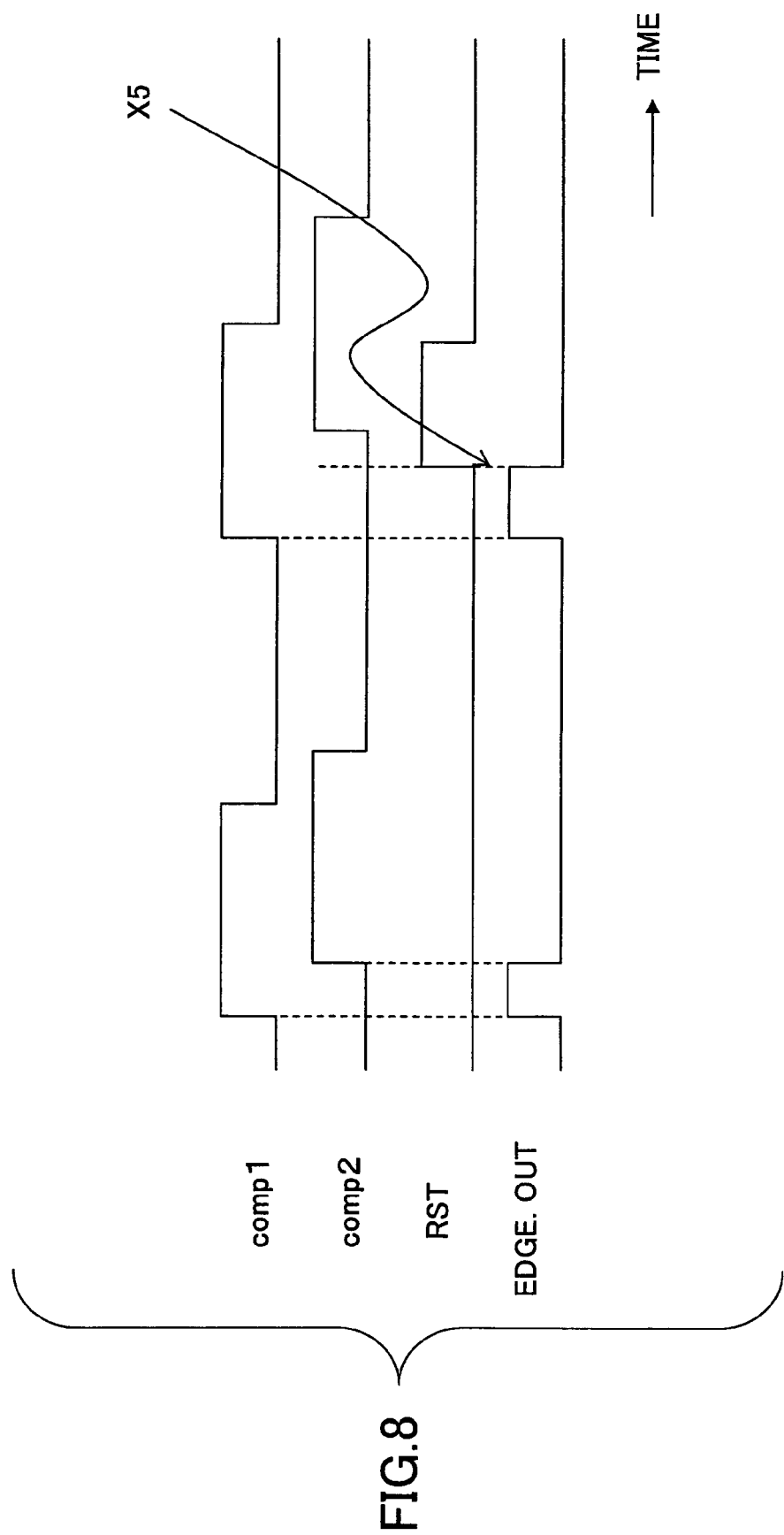
FIG. 8 is a timing chart for explaining an operation of the relative delay detection circuit.

FIG. 8 is a timing chart for explaining an operation of the relative delay detection circuit 11 shown in FIG. 7. In the case where the delay cell b is the target delay cell to be tested, the output signal D of the delay cell d is input to the reset terminal RST. Hence, as indicated by X5 in FIG. 8, it is possible to forcibly reset the relative delay detection circuit 11 at the timing not exceeding 1 period of the input signal of the delay chain 1.

If the target delay cell b to be tested is normal, the signal EDGE.OUT that is output from the relative delay detection circuit 11 and input to the clock input terminal of the flip-flop 12 is made up of pulses having an interval corresponding to a delay quantity (or delay time) of the delay cell b, and thus, the output signal FF1.Q of the flip-flop 12 makes a transition from the low level to the high level. In addition, the flip-flop 13 enters the output signal FF1.Q of the flip-flop 12 in response to the output signal D of the delay cell d within the delay chain 1 that is input to the clock input terminal of the flip-flop 13 as the clock input signal FF2.CLK. The signal FF1.Q entered by the flip-flop 13 is input to the data input terminal D-in of the judging circuit 14 as the input signal FF2.D, and whether or not the delay quantity of the delay cell b within the delay chain 1 is normal is judged at the timing of the output signal F of the delay cell f that is input to the clock input terminal CLK of the judging circuit 14. The judging circuit 14 judges that the delay cell b is normal if the input signal FF2.D that is input to the data input terminal D-in has a high level at the timing of the signal F that is input to the clock input terminal CLK. On the other hand, if the delay cell b is not normal (that is, abnormal), the signal EDGE.OUT that is output from the relative delay detection circuit 11 and input to the clock input terminal of the flip-flop 12 is not made up of pulses having an interval corresponding to the delay quantity of the delay cell b, and the judging circuit 14 judges that the delay cell b failed if the input signal FF2.D that is input to the data input terminal D-in of the judging circuit 14 has a low level.

The test circuit 10 shown in FIG. 4 may be provided similarly with respect to each of the delay cells a through c forming the first delay part of the delay chain 1, and the reset signal and the clock signal that are input to the test circuit 10 are obtained from the delay cells d through f (in this case, the delay cells d and f) forming the second delay part of the delay chain 1.

Figure 9:
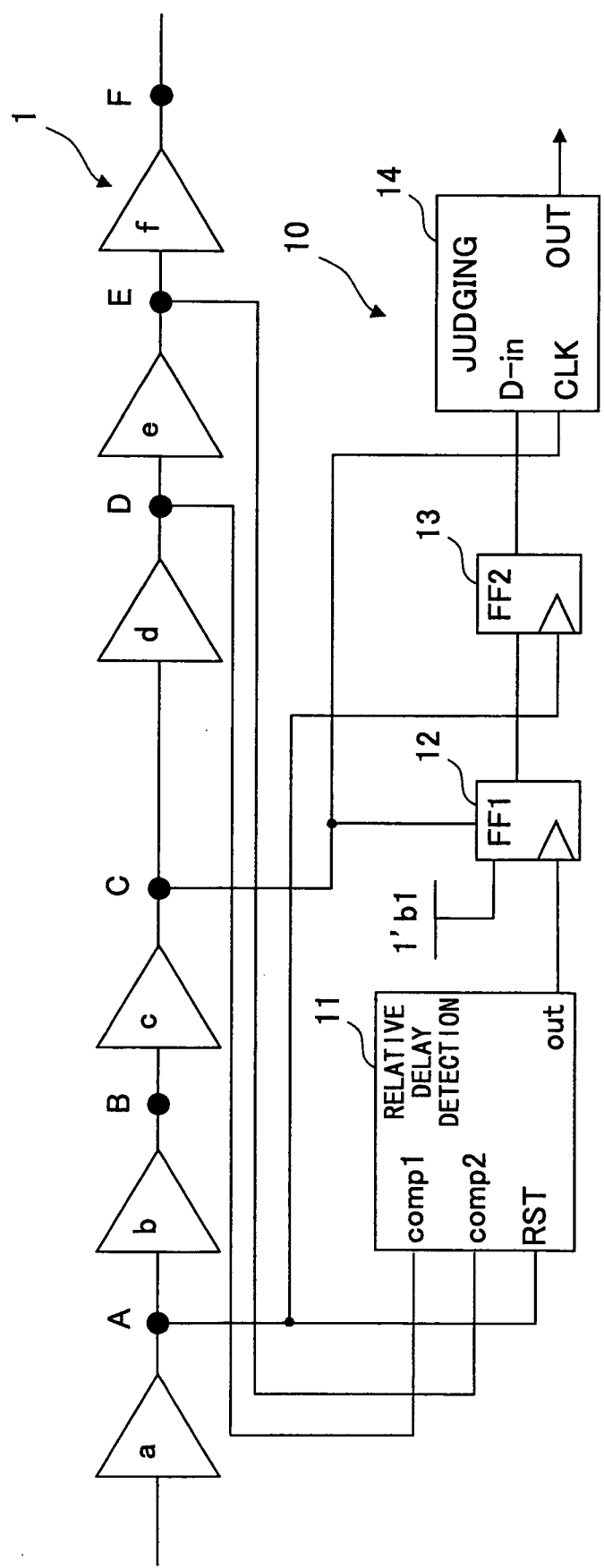
FIG. 9 is a diagram showing an important part of a test circuit that is provided with respect to another delay cell of the delay chain.

The test circuit 10 may be provided as shown in FIG. 9 with respect to each of the delay cells d through f forming the second delay part of the delay chain 1. FIG. 9 is a diagram showing an important part of the test circuit that is provided with respect to another delay cell e of the delay chain 1. In FIG. 9, those parts that are the same as those corresponding parts in FIG. 4 are designated by the same reference numerals, and a description thereof will be omitted. In other words, the test circuit 10 shown in FIG. 9 may be provided similarly with respect to each of the delay cells d through f forming the second delay part of the delay chain 1, and the reset signal and the clock signal that are input to the test circuit 10 are obtained from the delay cells a through c (in this case, the delay cells a and c) forming the first delay part of the delay chain 1.

Figure 10:
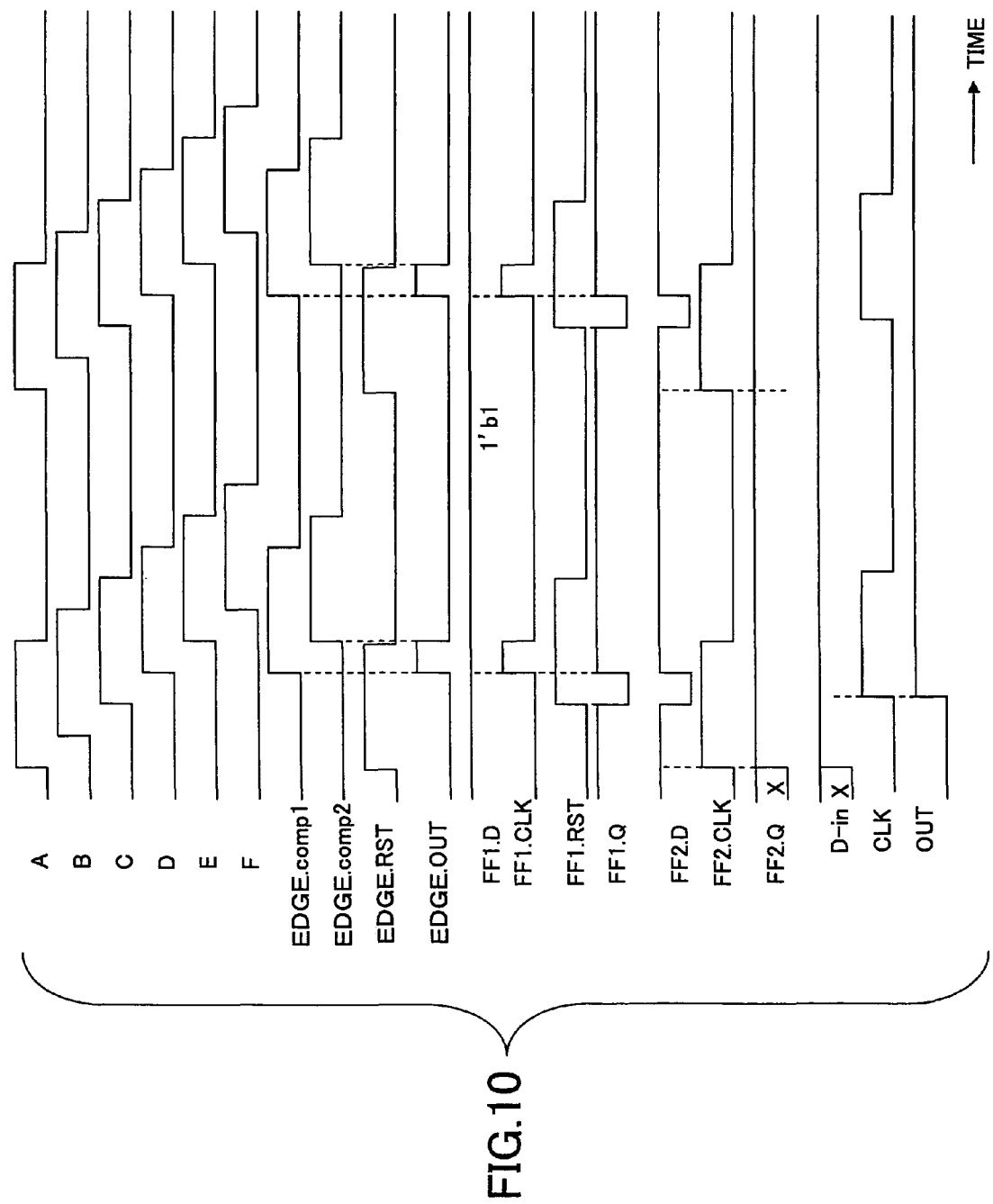
FIG. 10 is a timing chart showing signals at various parts shown in FIG. 9 when the delay chain is operating normally.
Figure 11:
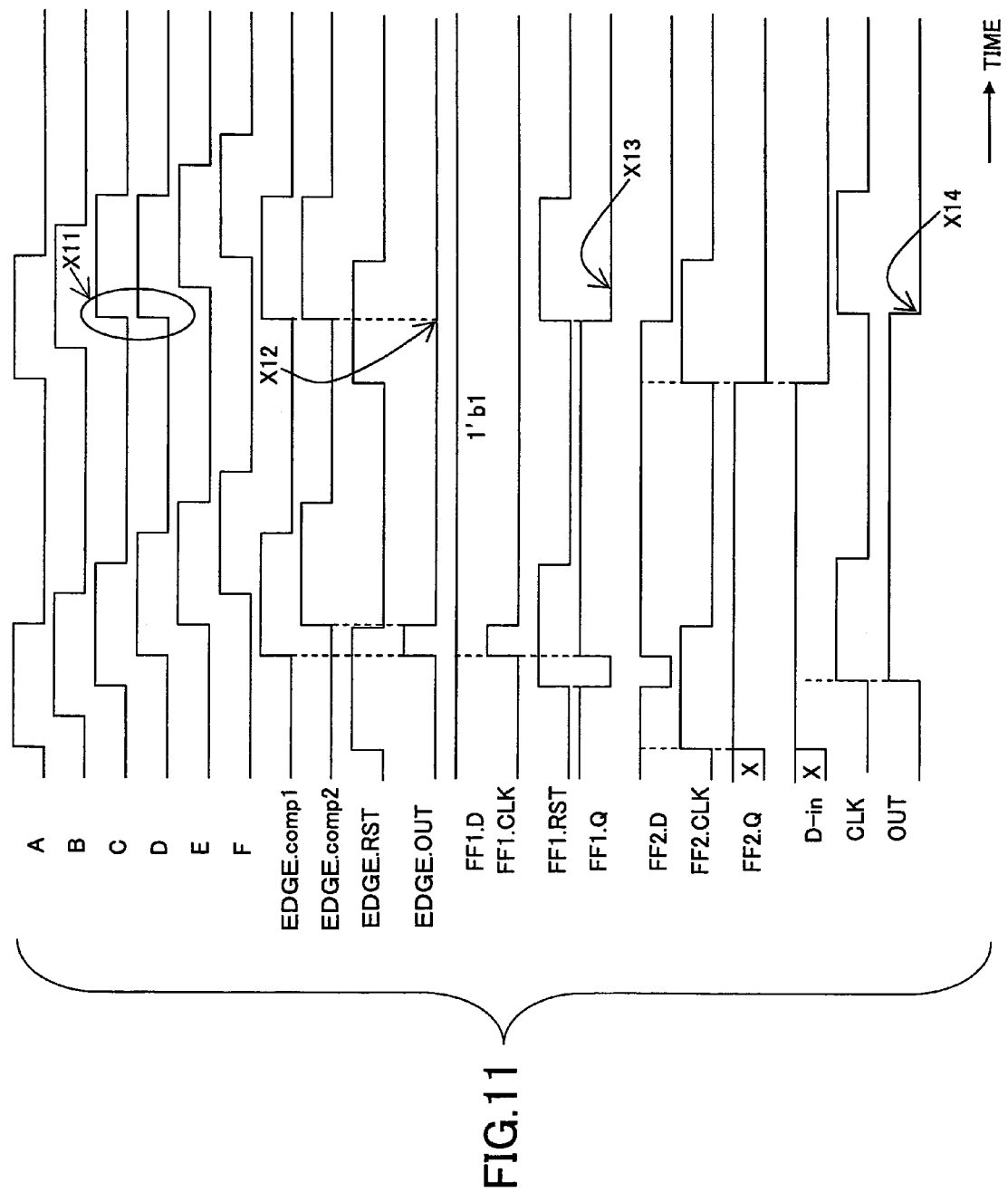
FIG. 11 is a timing chart showing signals at various parts shown in FIG. 9 when the delay chain is not operating normally.

FIG. 10 is a timing chart showing signals at various parts shown in FIG. 9 when the delay cell e of the delay chain 1 is normal and the delay chain 1 is operating normally. On the other hand, FIG. 11 is a timing chart showing signals at various parts shown in FIG. 9 when the delay cell e of the delay chain 1 fails and the delay chain 1 is not operating normally. As indicated by X11 in FIG. 11, the designed delay is not generated at the delay cell e. For this reason, as indicated by X12 in FIG. 11, a pulse indicating the relative delay is not generated at the output of the relative delay detection circuit 11, and because this pulse indicating the relative delay is not generated, the clock input of the flip-flop 12 does not make a transition to a high level (or a logical level "1") at a position indicated by X13 in FIG. 11. As a result, although the output of the judging circuit 14 has a high level as shown in FIG. 10 when the delay chain 1 is operating normally, the output of the judging circuit 14 has a low level (or a logical level "0") as indicated by X14 in FIG. 11 when the delay cell e fails and the delay chain 1 is not operating normally.

Figure 12:
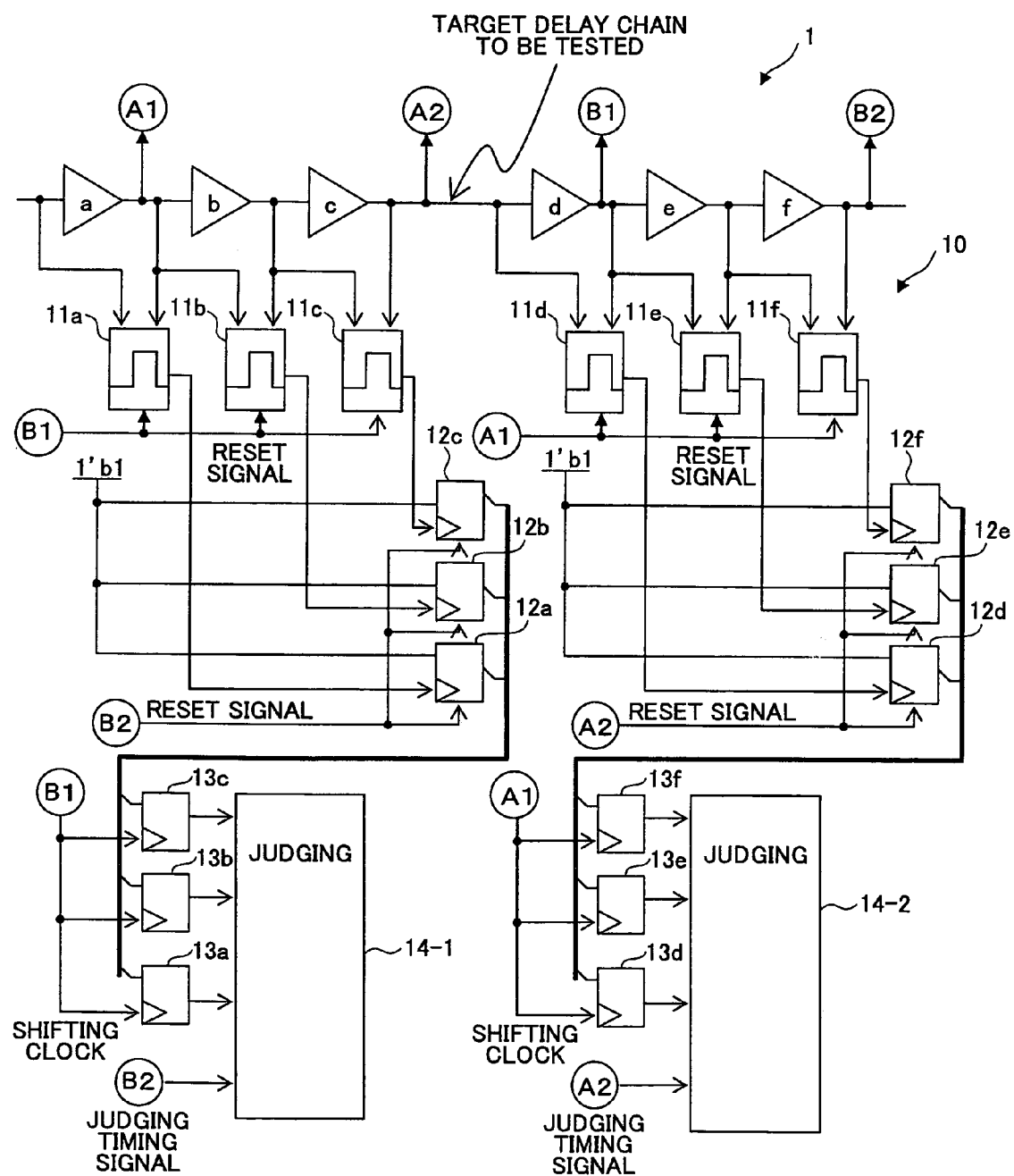
FIG. 12 is a diagram showing an entire test circuit that is provided with respect to all delay cells of the delay chain.

FIG. 12 is a diagram showing an entire test circuit that is provided with respect to all delay cells a through f of the delay chain 1. In FIG. 12, those parts that are the same as those corresponding parts in FIGS. 4 and 9 are designated by the same reference numerals, and a description thereof will be omitted. In FIG. 12, suffixes "a" through "f" added to the reference numerals of the constituent elements of the test circuit indicate that the constituent elements are provided with respect to the corresponding delay cells a through f. A judging circuit 14-1 is provided in common with respect to the first delay part that is formed by the delay cells a through c of the delay chain 1, and a judging circuit 14-2 is provided in common with respect to the second delay part that is formed by the delay elements d through f of the delay chain 1.

Figure 13:
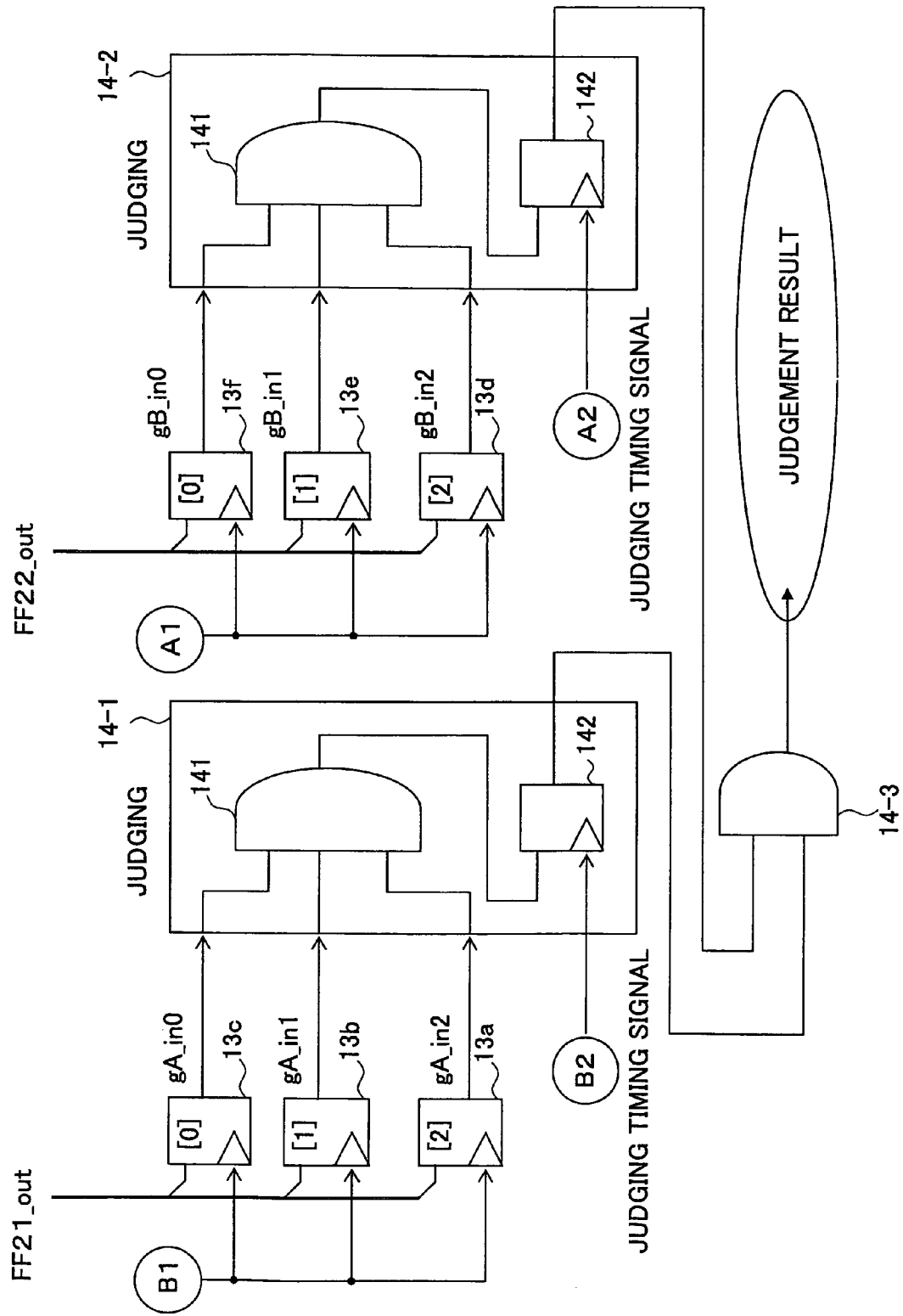
FIG. 13 is a circuit diagram showing a structure of judging circuits shown in FIG. 12 together with a portion of the test circuit.

FIG. 13 is a circuit diagram showing a structure of the judging circuits 14-1 and 14-2 shown in FIG. 12 together with a portion of the test circuit 10. In FIG. 13, FF21_out denotes outputs of flip-flops 12a through 12c, and FF22_out denotes outputs of flip-flops 12d through 12f. In addition, B1 denotes the output signal D of the delay cell d that is input to flip-flops 13a through 13c as a shifting clock signal, and A1 denotes the output signal A of the delay cell a that is input to flip-flops 13d through 13f as a shifting clock signal. Each of the judging circuits 14-1 and 14-2 has an AND circuit 141 that is input with outputs of the corresponding flip-flops 13a through 13c and 13d through 13f, and a flip-flop 142 having a data input terminal that receives an output of the AND circuit 141 and a clock input terminal that receives, as a judging timing signal which determines the judging timing, the output signals B2 and A2 of the corresponding one of the delay cells f and c. Output signals of the judging circuits 14-1 and 14-2 are input to an AND circuit 14-3, and an output signal of the AND circuit 14-3 indicates a judgement result, that is, a test result of the test that is carried out with respect to the delay chain 1.

Relative delay detection circuits 11a through 11c, the flip-flops 12a through 12c, the flip-flops 13a through 13c, and the judging circuit 14-1 form a first test circuit. Relative delay detection circuits 11d through 11f, the flip-flops 12d through 12f, the flip-flops 13d through 13f, and the judging circuit 14-2 form a second test circuit. The relative delay detection circuits 11a through 11c form a first detection circuit for detecting the relative delay times of the delay cells within the first delay part. The relative delay detection circuits 11d through 11f form a second detection circuit for detecting the relative delay times of the delay cells within the second delay part. The flip-flops 12a through 12c, the flip-flops 13a through 13c, and the judging circuit 14-1 form a first judging part for judging faults of the delay cells within the first delay part. The flip-flops 12d through 12f, the flip-flops 13d through 13f, and the judging circuit 14-2 form a second judging part for judging faults of the delay cells within the second delay part. The AND circuit 14-3 form an output part for outputting the test result with respect to the delay chain 1.

Figure 14:
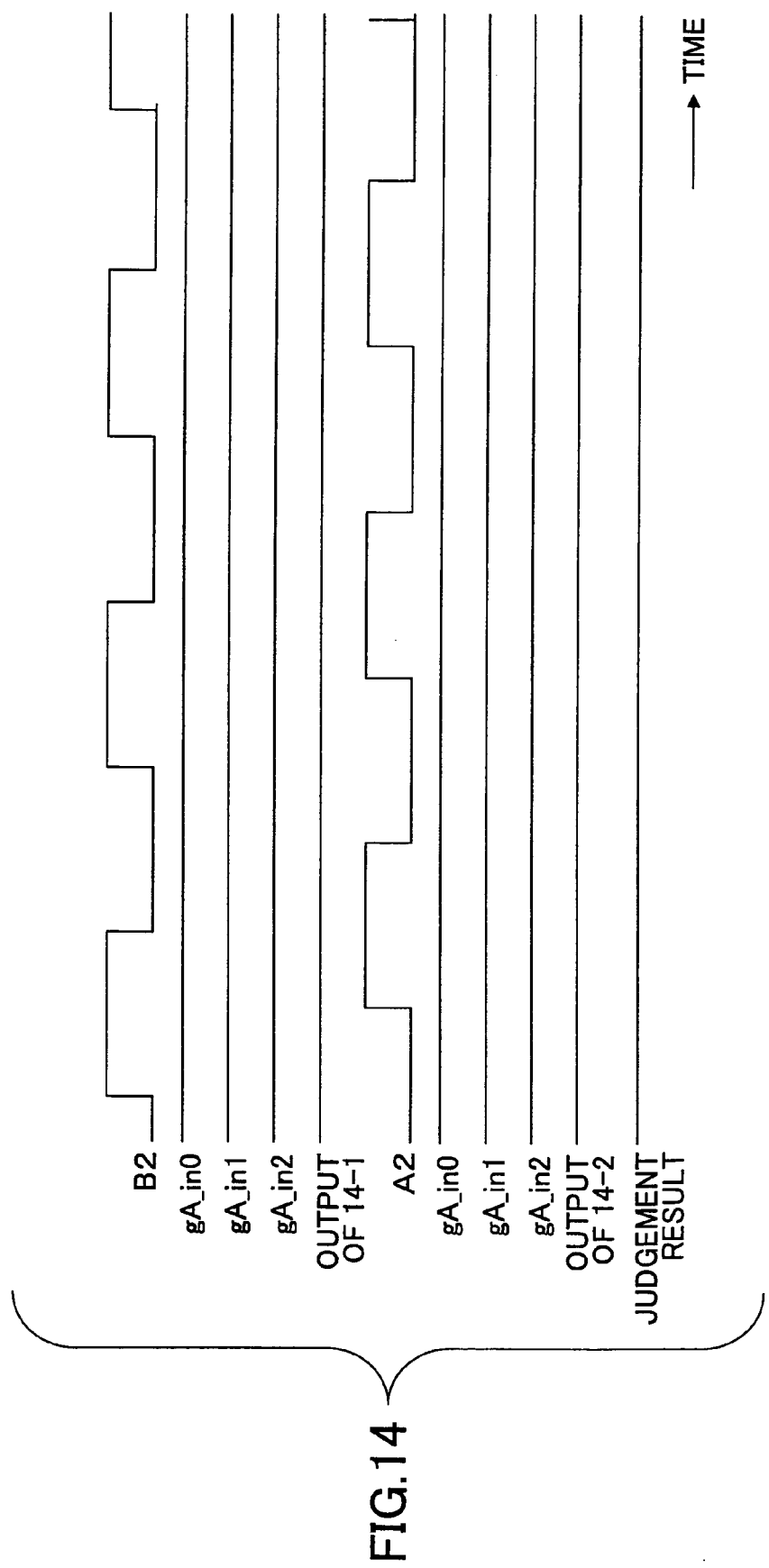
FIG. 14 is a timing chart showing signals at various parts shown in FIG. 13 when the delay chain is operating normally.
Figure 15:
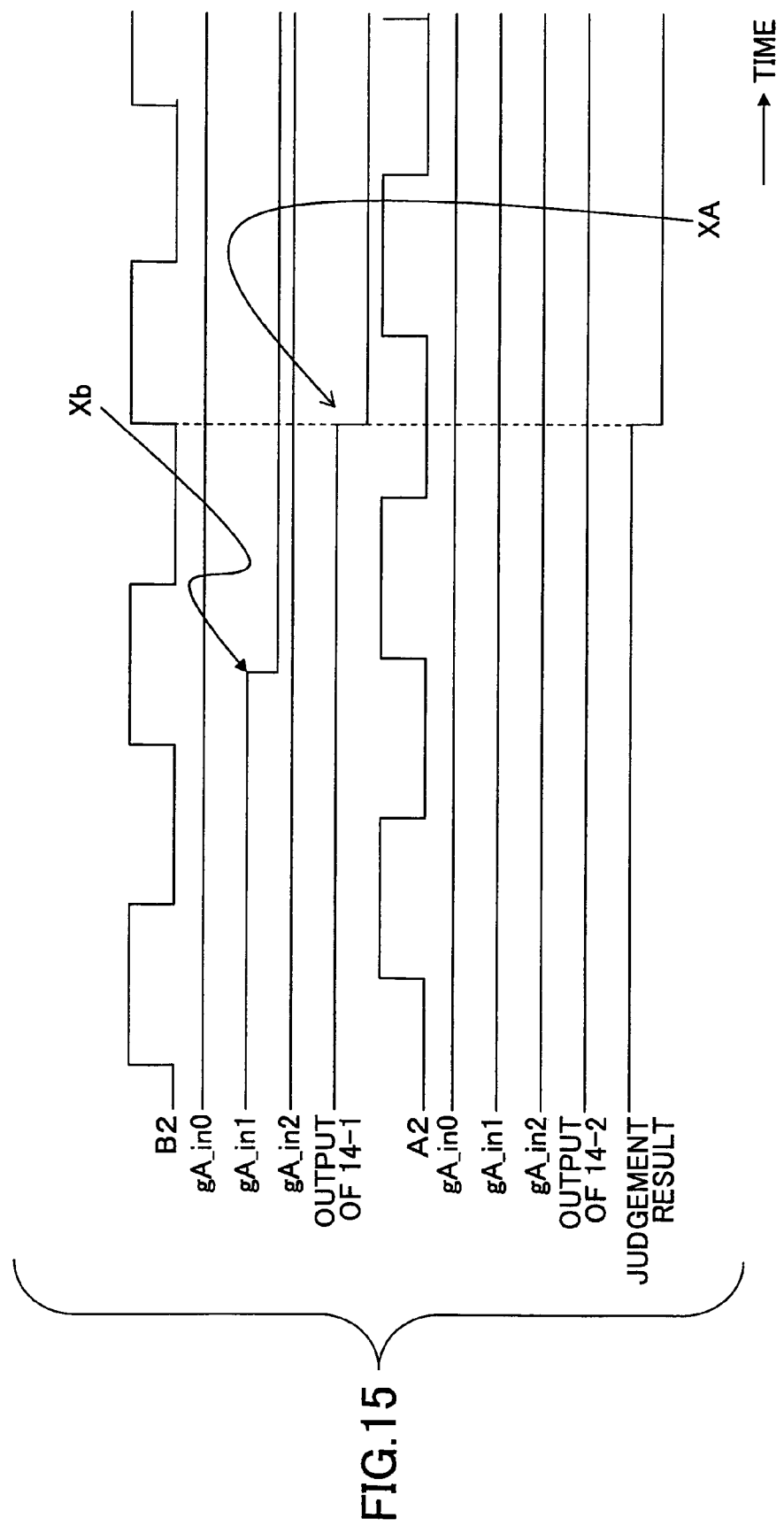
FIG. 15 is a timing chart showing signals at various parts shown in FIG. 13 when the delay chain is not operating normally.

FIG. 14 is a timing chart showing signals at various parts shown in FIG. 13 when the delay chain 1 is operating normally. On the other hand, FIG. 15 is a timing chart showing signals at various parts shown in FIG. 13 when the delay chain 1 is not operating normally. In FIGS. 14 and 15, "JUDGEMENT RESULT" indicates the output signal of the AND circuit 14-3. In addition, B2 indicates the output signal F of the delay cell f, and A2 indicates the output signal C of the delay cell c.

As shown in FIG. 14, when the delay chain 1 is operating normally, the output signal (judgement result) that is output from the AND circuit 14-3 always has a high level. However, when an output signal gA_om1 of the flip-flop 13b makes a transition to a low level at a timing indicated by Xb in FIG. 15 and the fault of the delay cell b is detected, the output signal of the judging circuit 14-1 makes a transition to a low level at a timing indicated by XA in FIG. 15. Hence, in the case shown in FIG. 15, the output signal (judgement result) that is output from the AND circuit 14-3 makes a transition to a low level at a timing corresponding to XA, and it is judged that a fault is detected in the delay chain 1. The output signal (judgement result) that is output from the AND circuit 14-3 is output from the semiconductor device to an external tester or the like. The tester can make an analysis based on the output signal (judgement result) that is output from the AND circuit 14-3, such as the timing when the output signal (judgement result) that is output from the AND circuit 14-3 makes the transition to the low level, so as to determine whether the fault is generated in the first delay part or the second delay part of the delay chain 1 or, determine the delay cell in which the fault is generated within the first delay part or the second delay part of the delay chain 1, for example.

In this embodiment, the test circuit 10 is provided within the semiconductor device in which the delay chain 1 is provided. In other words, the test circuit 10 and the delay chain 1 are provided within the same semiconductor device. For this reason, even if the pulse width that is output from the delay chain 1 is extremely narrow or the signal frequency output from the delay chain 1 is extremely high, it is unnecessary to output a high-frequency signal from the semiconductor device to an external tester or the like in order to carry out the test. In FIGS. 5 and 10, if the pulse width of the output signal EDGE.OUT of the relative delay detection circuit 11 is 100 ps or less, for example, the signal waveform of this high-frequency signal of 1 GHz or higher would be distorted if this high-frequency signal were output as it is outside the semiconductor device, due to the capacitance of the terminals (or pins) or the output load of the semiconductor device. But since the test in this embodiment is carried out by the test circuit 10 within the semiconductor device, it is possible to accurately and positively detect the fault of the delay chain 1 when forwarding the semiconductor device from a factory, for example. According to the existing technology, in order to enable the test to be carried out by an external tester by outputting an undistorted signal waveform from the semiconductor device, the pulse width must be approximately 4 ns or wider and the signal frequency must be approximately 250 MHz or lower. But according to this embodiment, it is possible to accurately detect the fault in the delay chain 1 even if the output signal of the delay chain 1 has a pulse width that is approximately 4 ns or narrower or, has a signal frequency exceeding 250 MHz.

Figure 16:
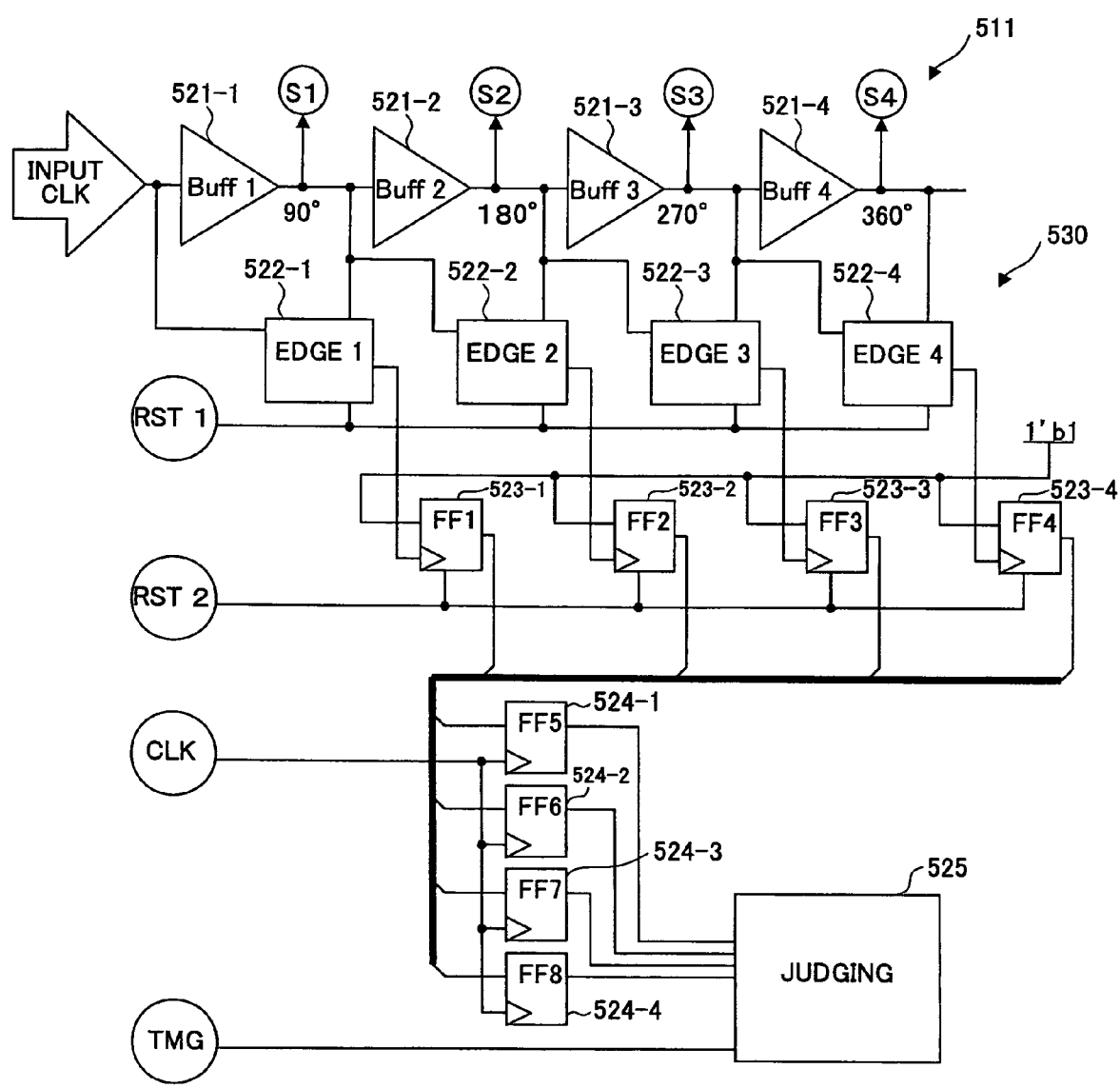
FIG. 16 is a diagram showing a comparison example.

Next, a description will be given of the reasons why two judging circuits, namely, the judging circuits 14-1 and 14-2, are provided with respect to the corresponding first and second delay parts forming the delay chain 1, by referring to a comparison example. FIG. 16 is a diagram showing the comparison example, and FIG. 17 is a timing chart for explaining an operation of the comparison example.

In FIG. 16, a delay chain 511 has a plurality of delay cells (or buffers) 521-1 through 521-4 that are connected in series. A test circuit 530 has relative delay detection circuits (or edge generation circuits) 522-1 through 522-4, flip-flops 523-1 through 523-4, flip-flops 524-1 through 524-4, and a judging circuit 525. The delay cells 521-1 and 521-2 form a first delay part of the delay chain 511, and the delay cells 521-3 and 521-4 form a second delay part of the delay chain 511. The single judging circuit 525 is provided in common with respect to the first and second delay parts of the delay chain 511.

Figure 17:
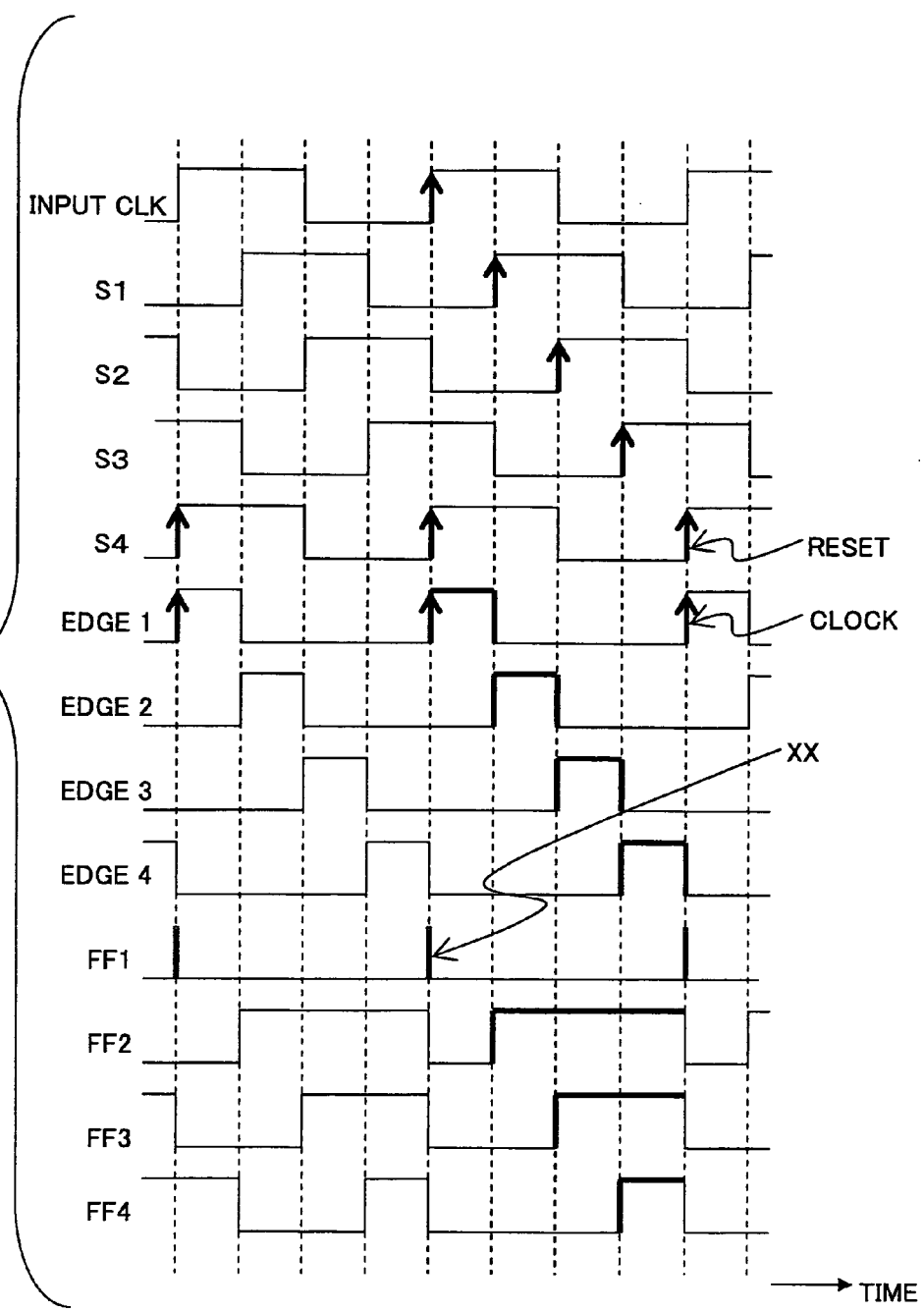
FIG. 17 is a timing chart for explaining an operation of the comparison example.

It is assumed in this case that an input clock CLK shown in FIG. 17 is input to the delay chain 511, and the phase of this input clock CLK is delayed by 90°, 180°, 270° and 360° by the delay cells 521-1, 521-2, 521-3 and 521-4, respectively, into signals S1, S2, S3 and S4 shown in FIG. 17. In addition, it is also assumed that the signal S4 is input to the relative delay detection circuits 522-1 through 522-4 as a reset signal RST1, input to the flip-flops 523-1 through 523-4 as a reset signal RST2, input to the flip-flops 524-1 through 524-4 as a clock signal CLK, and input to the judging circuit 525 as a judging timing signal TMG. In FIG. 17, EDGE1 through EDGE4 respectively denote output signals of the relative delay detection circuits 522-1 through 522-4, and FF1 through FF4 respectively denote output signals of the flip-flops 523-1 through 523-4. In this case, as indicated by XX in FIG. 17, the clock and the reset signal are simultaneously input to the flip-flop 523-1, and the test circuit 530 assumes a racing state to thereby cause failure of the fault detection operation. In addition, a similar problem occurs with respect to the judging timing signal TMG that is input to the judging circuit 525 to thereby cause failure of the judging operation.

Therefore, unless the judging operation with respect to the first delay part of the delay chain and the judging operation with respect to the second delay part of the delay chain are carried out separately as in the case of the embodiment described above, it is not possible to accurately and positively detect the fault within the delay chain.

On the other hand, in this embodiment, a test circuit part with respect to the first delay part of the delay chain is provided similarly with respect to each delay cell forming the first delay part of the delay chain. The reset signal and the clock signal that are input to this delay circuit part, which determine the delay time detection timing and the fault judging timing of the delay cells within the first delay part, are obtained from the delay cells forming the second delay part of the delay chain. In addition, a test circuit part with respect to the second delay part of the delay chain is provided similarly with respect to each delay cell forming the second delay part of the delay chain. The reset signal and the clock signal that are input to this delay circuit part, which determine the delay time detection timing and the fault judging timing of the delay cells within the second delay part, are obtained from the delay cells forming the first delay part of the delay chain. Accordingly, since the judging operation with respect to the first delay part of the delay chain and the judging operation with respect to the second delay part of the delay chain are carried out in parallel by separate test circuit parts, that is, by use of the 2 judging circuits of the test circuit, it is possible to accurately and positively detect the fault within the delay chain.

In the embodiment described above, each delay part forming the delay chain is made up of 3 delay cells, however, the number of delay cells forming each delay part is not limited to 3, and each delay part may be made up of 2 or more delay cells. In addition, the present invention is similarly applicable to a case where 2 or more delay parts forming the delay chain are connected in series. For example, if the delay chain is formed by M delay parts, where M is an integer greater than or equal to 2, the test circuit part that is provided with respect to the first delay part may obtain the reset signal and the clock signal for determining the delay time detection timing and the fault judging timing of the delay cells within the first delay part from the test circuit part that is provided with respect to the second delay part, . . ., the test circuit part that is provided with respect to the (M−1)th delay part may obtain the reset signal and the clock signal for determining the delay time detection timing and the fault judging timing of the delay cells within the (M−1)th delay part from the test circuit part that is provided with respect to the Mth delay part, and the test circuit part that is provided with respect to the Mth delay part may obtain the reset signal and the clock signal for determining the delay time detection timing and the fault judging timing of the delay cells within the Mth delay part from the test circuit part that is provided with respect to the first delay part. Measures are also taken in this case so that the relative delay detection circuits within each of the test circuit parts are forcibly reset at a timing not exceeding 1 period of the input signal with respect to the delay chain. The output of which delay cell within each delay part to be used as the reset signal, and the output of which delay cell within each delay part to be used as the clock signal, may be determined depending on the number of stages of the delay cells within each delay part, the number of delay parts within the delay chain, and the period and the pulse width of the input signal that is input to the delay chain.

This application claims the benefit of a Japanese Patent Application No. 2006-178476 filed Jun. 28, 2006, in the Japanese Patent Office, the disclosure of which is hereby incorporated by reference.

Further, the present invention is not limited to these embodiments, but various variations and modifications may be made without departing from the scope of the present invention.

What is claimed is:

1. A fault detection method for detecting, within a semiconductor device, a fault in a delay chain that is provided within the semiconductor device and is made up of a plurality of delay parts that are each formed by a plurality of delay cells, comprising:

a first judging step judging whether or not a fault of a first specific delay cell within a first delay part exists when testing the first specific delay cell, by detecting a first relative delay time between input and output signals of the first specific delay cell, and processing the first relative delay time at a timing based on an output of a delay cell within a second delay part that is provided at a stage preceding or subsequent to the first delay part; and a second judging step judging whether or not a fault of a second specific delay cell within the second delay part exists when testing the second specific delay cell, by detecting a second relative delay time between input and output signals of the second specific delay cell, and processing the second relative delay time at a timing based on an output of a delay cell within the first delay part.

2. The fault detection method as claimed in claim 1, wherein:

the first judging step detects the first relative delay time and judges the fault of the first specific delay cell at the timing based on the output of the delay cell within the second delay part; and the second judging step detects the second relative delay time and judges the fault of the second specific delay cell at the timing based on the output of the delay cell within the first delay part.

3. The fault detection method as claimed in claim 1, wherein the first and second judging steps are carried out in parallel using separate judging circuits.

4. The fault detection method as claimed in claim 1, wherein the first and second judging steps reset detection timings of the first and second relative delay times at timings not exceeding one period of an input signal with respect to the delay chain.

5. A test circuit for a delay chain made up of a plurality of delay parts that are each formed by a plurality of delay cells, comprising:

a first test circuit configured to test a first specific delay cell within a first delay part by detecting a first relative delay time between input and output signals of the first specific delay cell; and a second test circuit configured to test a second specific delay cell within a second delay part that is provided at a stage preceding or subsequent to the first delay part by detecting a second relative delay time between input and output signals of the second specific delay cell, wherein the first test circuit judges whether or not a fault of the first specific delay cell exists by processing the first relative delay time at a timing based on an output of a delay cell within the second delay part, and the second test circuit judges whether or not a fault of the second specific delay cell exists by processing the second relative delay time at a timing based on an output of a delay cell within the first delay part.

6. The test circuit as claimed in claim 5, wherein:
the first test circuit detects the first relative delay time and judges the fault of the first specific delay cell at the timing based on the output of the delay cell within the second delay part; and
the second test circuit detects the second relative delay time and judges the fault of the second specific delay cell at the timing based on the output of the delay cell within the first delay part.

7. The test circuit as claimed in claim 5, wherein the first and second test circuits reset detection timings of the first and second relative delay times at timings not exceeding one period of an input signal with respect to the delay chain.

8. The test circuit as claimed in claim 5, wherein:
the first delay part is provided at the stage preceding the second delay part;
the first test circuit comprises a first detection circuit configured to detect the first relative delay time from the input and output signals of the first specific delay cell at a timing based on an output signal of one delay cell within the second delay part, and a first judging part configured to judge whether or not the fault of the first specific delay cell exists from the first relative delay time based on an output signal of another delay cell within the second delay part; and
the second test circuit comprises a second detection circuit configured to detect the second relative delay time from the input and output signals of the second specific delay cell at a timing based on an output signal of one delay cell within the first delay part, and a second judging part configured to judge whether or not the fault of the second specific delay cell exists from the second relative delay time based on an output signal of another delay cell within the first delay part.

9. The test circuit as claimed in claim 8, further comprising:
an output part configured to output a test result of the delay chain based on output signals of the first and second judging parts.

10. The test circuit as claimed in claim 8, wherein detection timings of the first and second detection circuits to detect the first and second relative delay times are reset at timings not exceeding one period of an input signal with respect to the delay chain.

11. The test circuit as claimed in claim 8, wherein:
the first judging part comprises:
a first flip-flop configured to receive a fixed signal as data, an output of the first detection circuit as a clock, and the output signal of the another delay cell within the second delay part as a reset signal;
a second flip-flop configured to receive an output signal of the first flip-flop as data, and the output signal of the one delay cell within the second delay part as a clock; and
a first judging circuit configured to receive an output signal of the second flip-flop as data, and the output signal of the other delay cell within the second delay part as a clock, and to output a judgement result with respect to the fault of the first specific delay cell; and
the second judging part comprises:
a third flip-flop configured to receive the fixed signal as data, an output of the second detection circuit as a clock, and the output signal of the another delay cell within the first delay part as a reset signal;
a fourth flip-flop configured to receive an output signal of the third flip-flop as data, and the output signal of the one delay cell within the first delay part as a clock; and
a second judging circuit configured to receive an output signal of the fourth flip-flop as data, and the output signal of the other delay cell within the first delay part as a clock, and to output a judgement result with respect to the fault of the second specific delay cell.

12. The test circuit as claimed in claim 5, wherein the delay chain and the test circuit are provided on a single substrate.

13. A semiconductor device comprising:
a delay chain, provided on a substrate, and made up of a plurality of delay parts that are each formed by a plurality of delay cells; and
a test circuit provided on the substrate,
the test circuit comprising:
a first test circuit configured to test a first specific delay cell within a first delay part by detecting a first relative delay time between input and output signals of the first specific delay cell; and
a second test circuit configured to test a second specific delay cell within a second delay part that is provided at a stage preceding or subsequent to the first delay part by detecting a second relative delay time between input and output signals of the second specific delay cell,
wherein the first test circuit judges whether or not a fault of the first specific delay cell exists by processing the first relative delay time at a timing based on an output of a delay cell within the second delay part, and
the second test circuit judges whether or not a fault of the second specific delay cell exists by processing the second relative delay time at a timing based on an output of a delay cell within the first delay part.

14. The semiconductor device as claimed in claim 13, wherein:
the first test circuit of the test circuit detects the first relative delay time and judges the fault of the first specific delay cell at the timing based on the output of the delay cell within the second delay part; and
the second test circuit of the test circuit detects the second relative delay time and judges the fault of the second specific delay cell at the timing based on the output of the delay cell within the first delay part.

15. The semiconductor device as claimed in claim 13, wherein the first and second test circuits of the test circuit reset detection timings of the first and second relative delay times at timings not exceeding one period of an input signal with respect to the delay chain.

* * * * *